US008715918B2

(12) United States Patent
Toukhy et al.

(10) Patent No.: US 8,715,918 B2
(45) Date of Patent: May 6, 2014

(54) THICK FILM RESISTS

(75) Inventors: Medhat A. Toukhy, Flemington, NJ (US); Margareta Paunescu, Clinton, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 763 days.

(21) Appl. No.: 11/860,675

(22) Filed: Sep. 25, 2007

(65) Prior Publication Data

US 2009/0081589 A1 Mar. 26, 2009

(51) Int. Cl.
*G03F 7/039* (2006.01)
*G03F 7/20* (2006.01)
*G03F 7/30* (2006.01)

(52) U.S. Cl.
USPC ............... 430/326; 430/270.1; 430/271.1; 430/272.1; 430/275.1; 430/277.1; 430/278.1; 430/311; 430/905; 430/910

(58) Field of Classification Search
None
See application file for complete search history.

(56) References Cited

U.S. PATENT DOCUMENTS

| | | | |
|---|---|---|---|
| 5,492,793 A | 2/1996 | Breyta et al. | |
| 5,625,020 A | 4/1997 | Breyta et al. | |
| 5,641,604 A | 6/1997 | Sinta et al. | |
| 5,736,296 A | 4/1998 | Sato et al. | |
| 5,948,589 A | 9/1999 | Sato et al. | |
| 5,985,507 A | 11/1999 | Blakeney et al. | |
| 6,004,724 A | 12/1999 | Yamato et al. | |
| 6,027,804 A | 2/2000 | Chou et al. | |
| 6,033,826 A * | 3/2000 | Urano et al. | 430/270.1 |
| 6,072,006 A | 6/2000 | Bantu et al. | |
| 6,114,462 A | 9/2000 | Watanabe et al. | |
| 6,124,405 A | 9/2000 | Mertesdorf et al. | |
| 6,133,412 A | 10/2000 | Malik et al. | |
| 6,136,504 A | 10/2000 | Tan et al. | |
| 6,159,653 A | 12/2000 | Malik et al. | |
| 6,262,181 B1 | 7/2001 | Bantu et al. | |
| 6,284,427 B1 | 9/2001 | Okazaki et al. | |
| 6,309,793 B1 | 10/2001 | Malik et al. | |
| 6,365,321 B1 | 4/2002 | Chen et al. | |
| 6,465,150 B1 | 10/2002 | Numata et al. | |
| 6,506,537 B2 | 1/2003 | Kobayashi et al. | |
| 6,593,056 B2 | 7/2003 | Takeda et al. | |
| 6,630,282 B2 | 10/2003 | Oomori et al. | |
| 6,673,512 B1 | 1/2004 | Uenishi et al. | |
| 6,830,317 B2 | 12/2004 | Tsuchii et al. | |
| 6,830,870 B2 | 12/2004 | Malik et al. | |
| 6,869,744 B2 | 3/2005 | Hatakeyama | |
| 7,358,028 B2 | 4/2008 | Maruyama et al. | |
| 2001/0024765 A1* | 9/2001 | Okazaki et al. | 430/270.1 |
| 2002/0012869 A1 | 1/2002 | Adams et al. | |
| 2003/0219677 A1 | 11/2003 | Namba et al. | |
| 2005/0037291 A1 | 2/2005 | Nitta et al. | |
| 2005/0208733 A1* | 9/2005 | Yin et al. | 438/439 |
| 2006/0251986 A1 | 11/2006 | Sato et al. | |
| 2007/0281243 A1 | 12/2007 | Hirayama | |
| 2008/0153036 A1 | 6/2008 | Suetsugu et al. | |

FOREIGN PATENT DOCUMENTS

| | | |
|---|---|---|
| CN | 1239556 A | 12/1999 |
| EP | 0 939 339 A | 9/1999 |
| EP | 0 939 339 A1 | 9/1999 |
| EP | 0 609 684 B1 | 4/2000 |
| EP | 1 126 321 A1 | 8/2001 |
| EP | 1 415 968 A1 | 7/2002 |
| EP | 1 415 968 A | 5/2004 |
| JP | 58-194834 A | 11/1983 |
| JP | 3-185448 A | 8/1991 |
| JP | 4-211258 A | 8/1992 |
| JP | 6-43651 A | 2/1994 |
| JP | 6-148889 A | 5/1994 |
| JP | 6-289614 A | 10/1994 |
| JP | 7-134412 A | 5/1995 |
| JP | 9-68795 A | 3/1997 |
| JP | 10-31309 A | 2/1998 |
| JP | 10-204125 A | 8/1998 |
| JP | 10-207066 A | 8/1998 |
| JP | 10-268508 A | 10/1998 |
| JP | 2002-62656 A | 2/2002 |
| JP | 2002-99090 A | 4/2002 |
| JP | 2003-50460 A | 2/2003 |
| JP | 2003-84437 * | 3/2003 |
| JP | 2004-317907 A | 11/2004 |
| WO | WO 2005/081062 A1 | 9/2005 |

OTHER PUBLICATIONS

Machine-assisted English translation of JP2003-84437 as provided by JPO (2003).*
JPO English abstract for JP2003-84437 (2003).*
English Language Abstract of JP 10-31309 A.
Invitation to Pay Additional Fees and, where Applicable, Protest Fee (Form PCT/ISA/206), along with Annex to Form PCT/ISA/2006, for PCT/IB2008/002593.
Toukhy et al., "Chemically amplified, thick film, i-line positive resist for electroplating and redistribution applications", XP-002513378, SPIE vol. 6153 pp. 61534H-1-pp. 61534H-8 (2006).
English Language Abstract of JP 3-158448 A.
English Language Abstract of JP 4-211258 A.
English Language Abstract of JP 58-194834 A.
Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB2008/002593.
Toukhy et al., "Chemically amplified, thick film, i-line positive resist for electroplating and redistribution applications", XP-002513378, SPIE vol. 6153, , pp. 61534H-1-pp. 61534H-8 (2006).
Notification of First Office Action dated Aug. 31, 2011 for Chinese Patent Application No. 200880108713.2, which corresponds to U.S. Appl. No. 11/860,675.

(Continued)

*Primary Examiner* — Sin J. Lee
(74) *Attorney, Agent, or Firm* — Alan P. Kass; Sangya Jain

(57) ABSTRACT

Thick film photoresist compositions are disclosed.

12 Claims, No Drawings

(56) References Cited

OTHER PUBLICATIONS

English Language Translation of Notification of First Office Action dated Aug. 31, 2011 for Chinese Patent Application No. 200880108713.2, which corresponds to U.S. Appl. No. 11/860,675.

Notification of Second Office Action dated Aug. 16, 2012 for Chinese Patent Application No. 200880108713.2, which corresponds to U.S. Appl. No. 11/860,675.

Eng. Lang. Translation of Notification of Second Office Action dated Aug. 16, 2012 for Chinese Patent Application No. 200880108713.2, which corresponds to U.S. Appl. No. 11/860,675.

English Language Translation of Official Action mailed Dec. 25, 2012 for Japanese Patent Application No. 2010-526390, which corresponds to U.S. Appl. No. 11/860,675.

Notification of Third Office Action dated Mar. 28, 2013 for Chinese Patent Application No. 200880108713.2, which corresponds to U.S. Appl. No. 11/860,675.

English Language Translation of Notification of Third Office Action dated Mar. 28, 2013 for Chinese Patent Application No. 200880108713.2, which corresponds to U.S. Appl. No. 11/860,675.

* cited by examiner

THICK FILM RESISTS

FIELD OF INVENTION

The present invention relates to a light-sensitive photoresist composition especially useful for imaging thick films. In some instances, the photoresist film has a thickness greater than 2 microns. The invention further provides for a process for coating and imaging the light-sensitive composition of this invention.

BACKGROUND OF THE INVENTION

Photoresist compositions are used in microlithography processes for making miniaturized electronic components such as in the fabrication of computer chips and integrated circuits. Generally, in these processes, a coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble in such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution, plasma gases, or have metal or metal composites deposited in the spaces of the substrate where the photoresist coating was removed during development. The areas of the substrate where the photoresist coating still remains are protected. Later, the remaining areas of the photoresist coating may be removed during a stripping operation, leaving a patterned substrate surface. In some instances, it is desirable to heat treat the remaining photoresist layer, after the development step and before the etching step, to increase its adhesion to the underlying substrate.

In the manufacture of patterned structures, such as wafer level packaging, electrochemical deposition of electrical interconnects has been used as the density of the interconnects increases. For example, see Solomon, Electrochemically Deposited Solder Bumps for Wafer-Level Packaging, Packaging/Assembly, Solid State Technology. Gold bumps, copper posts and copper wires for redistribution in wafer level packaging require a resist mold that is later electroplated to form the final metal structures in advanced interconnect technologies. The resist layers are very thick compared to the photoresists used in the IC manufacturing of critical layers. Both feature size and resist thickness are typically in the range of 2 µm to 100 µm, so that high aspect ratios (resist thickness to line size) have to be patterned in the photoresist.

Devices manufactured for use as microelectromechanical machines also use very thick photoresist films to define the components of the machine.

SUMMARY OF THE INVENTION

A photoresist composition comprising a resin binder selected from the group consisting of
(1) a reaction product formed in the absence of a catalyst between (i) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (ii) a compound selected from a vinyl ether and an unsubstituted or substituted heteroalicyclic;
(2) a reaction product formed in the absence of a catalyst between (i) a novolak polymer, (ii) a polyhydroxy compound having 2 to 7 phenolic groups, and (iii) a compound selected from a vinyl ether and an unsubstituted or substituted heteroalicyclic;
(3) a reaction product formed in the absence of a catalyst between (i) a novolak polymer, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a compound selected from a vinyl ether and an unsubstituted or substituted heteroalicyclic;
(4) a mixture of (i) a reaction product formed in the absence of a catalyst between (a) a novolak polymer, (b) a polyhydroxy compound having 2 to 7 phenolic groups, and (c) a compound selected from a vinyl ether and an unsubstituted or substituted heteroalicyclic and (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking; and
(5) a mixture of (i) a reaction product formed in the absence of a catalyst between (a) a novolak polymer, (b) a polyhydroxy compound having 2 to 7 phenolic groups, and (c) a compound selected from a vinyl ether and an unsubstituted or substituted heteroalicyclic, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a novolak is disclosed.

The photoresist composition can also contain a photoacid generator as well as a base. A coated substrate having thereon a coating layer of the photoresist composition herein as well as a method for forming a photoresist relief image on a substrate using the photoresist composition herein are also disclosed.

DETAILED DESCRIPTION OF THE INVENTION

A photoresist composition comprising a resin binder selected from the group consisting of
(1) a reaction product formed in the absence of a catalyst between (i) a polymer comprising substituted or unsubstituted hydroxystyrene and acrylate, methacrylate or a mixture of acrylate and methacrylate, the acrylate and/or methacrylate being protected by an acid labile group that requires a a high activation energy for deblocking, and (ii) a compound selected from a vinyl ether and an unsubstituted or substituted heteroalicyclic;
(2) a reaction product formed in the absence of a catalyst between (i) a novolak polymer, (ii) a polyhydroxy compound having 2 to 7 phenolic groups, and (iii) a compound selected from a vinyl ether and an unsubstituted or substituted heteroalicyclic;
(3) a reaction product formed in the absence of a catalyst between (i) a novolak polymer, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a compound selected from a vinyl ether and an unsubstituted or substituted heteroalicyclic;
(4) a mixture of (i) a reaction product formed in the absence of a catalyst between (a) a novolak polymer, (b) a polyhydroxy compound having 2 to 7 phenolic groups, and (c) a compound selected from a vinyl ether and an unsubstituted or substituted heteroalicyclic and (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking; and
(5) a mixture of (i) a reaction product formed in the absence of a catalyst between (a) a novolak polymer, (b) a polyhydroxy compound having 2 to 7 phenolic groups, and (c) a compound selected from a vinyl ether and an unsubstituted or substituted heteroalicyclic, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a novolak is disclosed.

The photoresist composition can also contain a photoacid generator as well as a base. A coated substrate having thereon a coating layer of the photoresist composition herein as well as a method for forming a photoresist relief image on a substrate using the photoresist composition herein are also disclosed.

The thickness of a coating film formed by the photoresist composition can be greater than 2 microns with photoresist films as thick as 200 microns being imaged. The photoresist is useful for imaging photoresist films on several types of substrates, for example, copper substrates requiring an aspect ratio of greater than 3 (aspect ratio is the ratio of height to width of the photoresist pattern).

The hydroxystyrene monomer or oligomer component of the polymer provides base solubility to the polymer in the resist composition. The hydroxystyrene is suitably the para or meta isomer and can be substituted with various substituents which do not interfere with the lithographic utility of the polymer such as halogens, methoxy, or lower alkyl (e.g. methyl or ethyl). α-methyl hydroxystyrene can also be used in the polymer herein.

The acrylate or methacrylate monomer or oligomer component of the polymer provides acid sensitivity to the polymer. The ester group of the acrylate or the methacrylate is an acid labile group which inhibits the dissolution of the polymer in alkaline developer or polar solvent. The ester group is cleaved by a photoacid generator and/or a post exposure bake and it is converted from a dissolution inhibiting ester to a base soluble organic acid functionality thereby enabling image development of the composition. The acrylate or methacrylate can be provided with a variety of t-butylester or other ester groups which are well known to the skilled artisan which contain a secondary or tertiary carbon atom next to the oxygen atom of the ester bond, which can also be described as an acid labile group that requires a high activation energy for deblocking than an acetal group. Acetal groups are acid labile groups that require a low activation energy for deblocking. Using acid labile groups that have a high activation energy would prevent the deblocking of the acrylate, methacrylate, or mixtures thereof during the reaction of the polymer comprising hydroxystyrene and acrylate, methacrylate, or a mixture thereof with vinyl ether in the absence of a catalyst, providing a more stable polymer resin for use in the compositions described herein. The use of a catalyst would cause the acrylate, methacrylate or mixtures thereof to become deblocked during the reaction, resulting in an unwanted product.

The copolymer used herein can be prepared by standard radical copolymerization to yield random copolymers. For example, t-butyl methacrylate can be copolymerized with (i) p-tert-butoxycarbonyloxystyrene (a hydroxystyrene precursor monomer) with subsequent thermal cleavage or mild acidolysis of the t-butoxycarbonyl group to form p-hydroxystyrene/t-butyl methacrylate copolymer or (ii) with p-t-butyl (dimethyl)silyloxystyrene with subsequent desilylation with fluoride. Alternatively, acetoxystyrene is copolymerized with acrylate or methacrylate. Generally acetoxystyrene is mixed under nitrogen at an elevated temperature of about 50° to 100° C. with the ester monomer in a suitable solvent such as toluene or THF, along with a small amount of a free radical catalyst such as benzoyl peroxide. The product polymer poly(acetoxystyrene-co-acrylate) is then deacylated with mild base (e.g. dimethylaminopyridine, ammonium hydroxide, carbonate or bicarbonate) in a nonaqueous solvent such as an alcohol solvent (methanol or propanol) to form the hydroxystyrene/acrylate copolymer. Alternatively, the hydroxystyrene/acrylate or methacrylate copolymer can be a block copolymer.

The copolymer can contain the hydroxystyrene unit in the range of 50 to 90 mol %, depending on the desired dissolution rate/sensitivity. The copolymer typically has a number-average molecular weight (relative to polystyrene standard) ranging from 7,000 to 50,000. The copolymer has a high glass transition temperature of about 140° C. to about 170° C. The copolymer also has a high acid sensitivity. The acid labile ester groups of the copolymer are surprising thermally stable in the presence of the phenolic hydroxy groups up to a temperature of about 180° C. This enables a high pre-exposure heating of a film of the composition which results in substantially improved lithographic performance.

The novolak resin useful herein is prepared by subjecting a phenol or a substituted phenol to an addition-condensation reaction of a phenol or substituted phenol (or a combination thereof) and an aldehyde or ketone (or a combination thereof), in the presence of an acid or a divalent metal salt catalyst, in a suitable reaction solvent, as are well known to one skilled in the art of photoresists. Suitable phenols include, but are not limited to, phenol, chlorophenols, fluorophenols, m-cresol, o-cresol, p-cresol, m-ethyl phenol, o-ethyl phenol, p-ethyl phenol, m-butyl phenol, o-butyl phenol, p-butyl phenol, trimethylsilylphenol, chloromethylphenol 2,3-xylenol, 2,4-xylenol, 2,5-xylenol, 2,6-xylenol, 3,4-xylenol, 3,5-xylenol, 3,6-xylenol, o-phenyl phenol, m-phenyl phenol, p-phenyl phenol, 2,3,5-trimethylphenol, 2,3,5-triethylphenol, 3,4,5-trimethylphenol, 4-tert-butylphenol, 3-tert-butylphenol, 2-tert-butylphenol, 2-tert-butyl-4-methylphenol, 2-tert-butyl-5-methylphenol and other alkyl-substituted phenols; p-methoxyphenol, m-methoxyphenol, o-methoxyphenol, p-ethoxyphenol, m-ethoxyphenol, o-ethoxyphenol, o-propoxyphenol, p-propoxyphenol, propoxyphenol and other alkoxy-substituted phenols; o-isopropenylphenol, p-isopropenylphenol, 2-methyl-4-isopropenylphenol, 2-ethyl-4-isopropenylphenol and other isopropenyl-substituted phenols: phenylphenol and other aryl-substituted phenols; 4,4'-dihydroxybiphenyl, bisphenol A, hydroquinone, resorcinol, 2-methyl resorcinol, 5-methyl resorcinol, pyrogallol, catechol, and other polyhydroxyphenols, as are well known to those skilled in the photoresist art. These phenols may be used either alone or in an admixture of two or more, depending upon the dissolution rate desired.

As for examples of the aldehyde, there may be used, either alone or in combination, those such as formaldehyde, paraformaldehyde, acetaldehyde, benzaldehyde, furfural, trioxane, propionaldehyde, butylaldehyde, trimethylacetaldehyde, acrolein (acrylaldehyde), crotonaldehyde, cyclohexanaldehyde, furylacrolein, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde, and the like.

Examples of the ketones include acetone, methyl ethyl ketone, diethyl ketone and diphenyl ketone. Each of these ketones may be used singly or in combination. Further, an optional combination of any of aldehydes and any of ketones can be employed.

As the acid catalyst, there may be utilized inorganic acids such as hydrochloric acid, nitric acid, sulfuric acid and the like, organic acids such as formic acid, oxalic acid, maleic acid and the like, and divalent inorganic metal salts of copper, cobalt, magnesium, manganese, nickel, zinc and the like. The reaction solvent is normally a hydrophilic solvent, such as methanol or dioxane. Examples of alkali-soluble, film forming novolak resins include phenol-formaldehyde novolaks, cresol-formaldehyde novolaks, and phenol-modified xylenol-formaldehyde novolaks. Novolak resins have been commonly used in the art of photoresist manufacture as exemplified by "Chemistry and Application of Phenolic Resins", Knop A. and Scheib, W.; Springer Verlag, N.Y., 1979 in Chapter 4.

The polyhydroxy compound having 2 to 7 phenolic groups can include polyhydroxybenzophenones, polyhydroxyphenylalkylketones, bis(polyhydroxyphenyl)alkanes, polyhydroxybenzoates, bis(polyhydroxybenzoyl)alkanes, bis(polyhydroxybenzoyl)aryls, alkylene di(polyhydroxybenzoates), polyhydroxybiphenyls, bis(polyhydroxy)sulfides, bis(polyhydroxyphenyl)ethers, bis(polyhydroxyphenyl)sulfoxides, bis(polyhydroxyphenyl)sulfones, polyhydroxytriphenylmethanes, polyhydroxy-spirobi-indanes, polyhydroxyphthalides, terminal xylenol linear tetranuclear compounds, linear pentanuclear compounds, linear tetranuclear compounds, non-linear tetranuclear compounds, such as, for example, (a) polyhydroxybenzophenones such as 2,4-dihydroxybenzophenone, 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2'4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,2',3,4,6'-pentahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, 2,3,3',4,4',5'-hexahydroxybenzophenone, 2,4,6,3',4',5'-hexahydroxybenzophenone, and 2,3,4,3',4',5'-hexahydroxybenzophenone;

(b) polyhydroxyphenylalkylketones such as 2,3,4-trihydroxyacetophenone, 2,3,4-trihydroxyphenylpentylketone, and 2,3,4-trihydroxyphenylhexylketone;

(c) bis(polyhydroxyphenyl)alkanes such as bis(2,3,4-trihydroxyphenyl)methane, bis(2,4-dihydroxyphenyl)methane, and bis(2,3,4-trihydroxyphenyl)propane;

(d) polyhydroxybenzoates such as propyl 3,4,5-trihydroxybenzoate, phenyl 2,3,4-trihydroxybenzoate, and phenyl 3,4,5-trihydroxybenzoate;

(e) bis(polyhydroxybenzoyl)alkanes or bis(polyhydroxybenzoyl)aryls such as bis(2,3,4-trihydroxybenzoyl)methane, bis(3-acetyl-4,5,6-trihydroxyphenyl)methane, bis(2,3,4-trihydroxybenzoyl)benzene, and bis(2,4,6-trihydroxybenzoyl)benzene;

(f) alkylene di(polyhydroxybenzoates) such as ethyleneglycol-di(3,5-dihydroxybenzoate) and ethylene glycoldi(3,4,5-trihydroxybenzoate);

(g) polyhydroxybiphenyls such as 2,3,4-biphenyltriol, 3,4,5-biphenyltriol, 3,5,3'5'-biphenyltetrol, 2,4,2',4'-biphenyltetrol, 2,4,6,3',5'-biphenylpentol, 2,4,6,2',4',6'-biphenylhexyl, and 2,3,4,2',3',4'-biphenylhexyl;

(h) bis(polyhydroxy)sulfides such as 4,4'-thiobis(1,3-dihydroxy)benzene;

(i) bis(polyhydroxyphenyl)ethers such as 2,2'4,4'-tetrahydroxydiphenyl ether;

(j) bis(polyhydroxyphenyl)sulfoxides such as 2,2'4,4'-tetrahydroxydiphenylsulfoxide;

(k) bis(polyhydroxyphenyl)sulfones such as 2,2',4,4'-tetrahydroxydiphenylsulfone;

(l) polyhydroxytriphenylmethanes such as tris(4-hydroxyphenyl)methane), 4,4',4''-trihydroxy-3,5,3',5'-tetramethyltriphenylmethane, 4,4',3'',4''-tetrahydroxy-3,5,3',5'-tetramethyltriphenylmethane, 4,4',2'',3'',4''-pentahydroxy-3,5,3',5'-tetramethyltriphenylmethane, 2,3,4,2',3',4'-hexahydroxy-5,5'-diacetyltriphenylmethane, 2,3,4,2',3',4',3'',4''-octahydroxy-5,5-diacetyltriphenylmethane, and 2,4,6,2',4',6'-hexahydroxy-5,5'-dipropionyltriphenylmethane;

(m) polyhydroxy-spirobi-indanes such as 3,3,3',3'-tetramethyl-1,1'-spirobi-indane-5,6,5',6'-tetrol, 3,3,3'3'-tetramethyl-1,1'-spirobi-indane-5,6,7,6'6',7'-hexyl, and 3,3,3'3'-tetramethyl-1,1'-spirobi-indane-4,5,6,4',5',6'-hexyl;

(n) polyhydroxyphthalides such as 3,3-bis(3,4-dihydroxyphenyl)phthalide, 3,3-bis(2,3,4-trihydroxyphenyl)phthalide, and 3',4',5',6'-tetrahydroxyspiro(phthalide-3,9'-xanthene);

(o) polyhydroxy compounds described in JP No. 4-253058 such as α,α',α''-tris(4-hydroxyphenyl)-1,3,5-triisopropylbenzene, α,α',α''-tris(3,5-dimethyl-4-hydroxyphenyl)-1,3,5-triisopropylbenzene, α,α',α''-tris(3,5-diethyl-4-hydroxyphenyl)-1,3,5-triisopropylbenzene, α,α',α''-tris(3,5-di-n-propyl-4-hydroxyphenyl)-1,3,5-triisopropylbenzene, α,α',α''-tris(3,5-diisopropyl-4-hydroxyphenyl)-1,3,5-triisopropylbenzene, α,α',α''-tris(3,5-di-n-butyl-4-hydroxyphenyl)-1,3,5-triisopropylbenzene, α,α',α''-tris(3-methyl-4-hydroxyphenyl)-1,3,5-triisopropyl-benzene, α,α',α''-tris (3-methoxy-4-hydroxyphenyl)-1,3,5-triisopropylbenzene, α,α',α''-tris(2,4-dihydroxyphenyl)-1,3,5-triisopropylbenzene, 2,4,6-tris(3,5-dimethyl-4-hydroxyphenylthiomethyl)mesitylene, 1-[α-methyl-α-(4''-hydroxyphenyl)ethyl]-4-[α,α'-bis(4''-hydroxyphenyl)ethyl]benzene, 1-[α-methyl-α-(4'-hydroxyphenyl)ethyl]-3-[α,α'-bis(4''-hydroxy-phenyl)ethyl]benzene, 1-[alpha-methyl-α-(3',5'-dimethyl-4'-hydroxyphenyl)ethyl]benzene, 1-[α-methyl-α-(3'-methoxy-4'-hydroxyphenyl)ethyl]-4-[α',α'-bis(3'-methoxy-4'-hydroxyphenyl)ethyl]benzene, and 1-[α-methyl-α-(2',4'-dihydroxyphenyl)ethyl]-4-[α',α'-bis(4'-hydroxyphenyl)ethyl]benzene.

In addition, the polyhydroxy compound having 2 to 7 phenolic groups can also include a compound having formula (I)

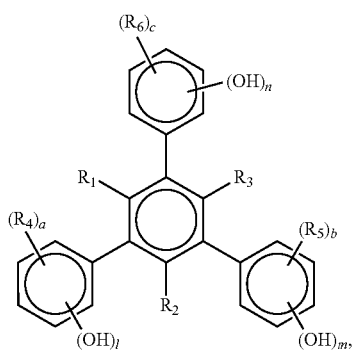

a compound having formula (II)

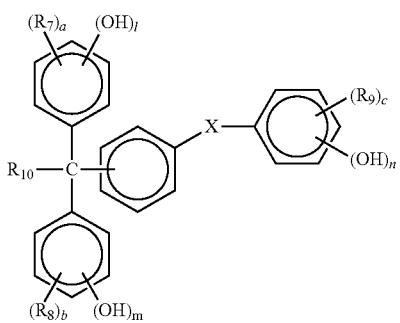

wherein for formula (I) or (II), X is a direct bond, lower alkylene or $CH_2$—Y; Y is O or S; each of $R_1$ to $R_9$ is independently alkyl, alkoxy, H, or halogen; $R_{10}$ is H or alkyl; each of a, b, and c is an integer of 2 to 4; each of l, m, and n is an integer of 1 to 3;

a compound having formula (III)

wherein $R_{11}$, $R_{12}$, $R_{13}$, $R_{14}$, $R_{15}$, $R_{16}$ and $R_{17}$ each represents independently H, a $C_1$ to $C_4$ alkyl group, a $C_1$ to $C_4$ alkoxyl group, a cyclohexyl group or a group represented by the formula:

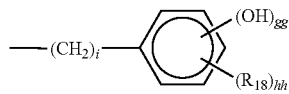

wherein $R_{18}$ represents H, a $C_1$ to $C_4$ alkyl group, a $C_1$ to $C_4$ alkoxyl group or a cyclohexyl group; each of mm and nn is 0, 1 or 2; each of aa, bb, cc, dd, ee, ff, gg and hh is 0 or an integer of 1 to 5 satisfying aa+bb≤5, cc+dd≤5, ee+ff≤5, and gg+hh≤5; i is 0, 1 or 2, and where the number of phenolic groups are from 2 to 7; or mixtures thereof.

Examples of the polyhydroxy compound having 2 to 7 phenolic groups can also include 2,4-dihydroxybenzophenone, 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2'4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,2',3,4,6'-pentahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, 2,3,3',4,4',5'-hexahydroxybenzophenone, 2,4,6,3',4',5'-hexahydroxybenzophenone, 2,3,4,3',4',5'-hexahydroxybenzophenone, 2,3,4-trihydroxyacetophenone, 2,3,4-trihydroxyphenylpentylketone, 2,3,4-trihydroxyphenylhexylketone, bis(2,3,4-trihydroxyphenyl)methane, bis(2,4-dihydroxyphenyl)methane, bis(2,3,4-trihydroxyphenyl)propane, propyl 3,4,5-trihydroxy-benzoate, phenyl 2,3,4-trihydroxybenzoate, phenyl 3,4,5-trihydroxybenzoate, bis(2,3,4-trihydroxybenzoyl)methane, bis(3-acetyl-4,5,6-trihydroxyphenyl)methane, bis(2,3,4-trihydroxybenzoyl)benzene, bis(2,4,6-trihydroxybenzoyl)benzene, ethyleneglycol-di(3,5-dihydroxybenzoate) ethylene glycoldi(3,4,5-trihydroxybenzoate),2,3,4-biphenyltriol, 3,4,5-biphenyltriol, 3,5,3'5'-biphenyltetrol, 2,4,2',4'-biphenyltetrol, 2,4,6,3',5'-biphenylpentol, 2,4,6,2',4',6'-biphenylhexyl, 2,3,4,2',3',4'-biphenylhexyl, 4,4'-thiobis(1,3-dihydroxy)benzene, 2,2'4,4'-tetrahydroxydiphenyl ether, 2,2'4,4'-tetrahydroxydiphenylsulfoxide, 2,2',4,4'-tetrahydroxydiphenylsulfone, tris(4-hydroxyphenyl)methane), 4,4',4''-trihydroxy-3,5,3',5'-tetramethyltriphenylmethane, 4,4',3'',4''-tetrahydroxy-3,5,3',5'-tetramethyltriphenylmethane, 4,4',2'',3'',4''-pentahydroxy-3,5,3',5'-tetramethyltriphenylmethane, 2,3,4,2',3',4'-hexahydroxy-5,5'-diacetyltriphenylmethane, 2,3,4,2',3',4',

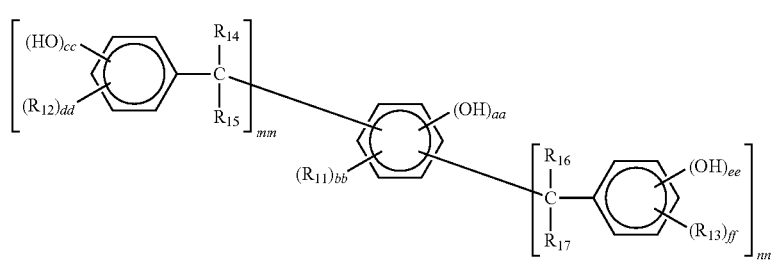

3'',4''-octahydroxy-5,5-diacetyltriphenylmethane, 2,4,6,2',4', 6'-hexahydroxy-5,5'-dipropionyltriphenylmethane, 3,3,3',3'-tetramethyl-1,1'-spirobi-indane-5,6,5',6'-tetrol, 3,3,3'3'-tetramethyl-1,1'-spirobi-indane-5,6,7,6'6',7'-hexyl, 3,3,3'3'-tetramethyl-1,1'-spirobi-indane-4,5,6,4',5',6'-hexyl, 3,3-bis (3,4-dihydroxyphenyl)phthalide, 3,3-bis(2,3,4-trihydroxyphenyl)phthalide, 3',4',5',6'-tetrahydroxyspiro (phthalide-3,9'-xanthene), α,α',α''-tris(4-hydroxyphenyl)-1, 3,5-triisopropylbenzene, α,α',α''-tris(3,5-dimethyl-4-hydroxyphenyl)-1,3,5-triisopropylbenzene, α,α',α''-tris(3,5-diethyl-4-hydroxyphenyl)-1,3,5-triisopropylbenzene, α,α', α''-tris(3,5-di-n-propyl-4-hydroxyphenyl)-1,3,5-tri-isopropylbenzene, α,α',α''-tris(3,5-diisopropyl-4-hydroxyphenyl)-1,3,5-triisopropylbenzene, α,α',α''-tris(3,5-di-n-butyl-4-hydroxyphenyl)-1,3,5-triisopropylbenzene, α,α',α''-tris(3-methyl-4-hydroxyphenyl)-1,3,5-triisopropyl-benzene, α,α',α''-tris(3-methoxy-4-hydroxyphenyl)-1,3,5-triisopropylbenzene, α,α',α''-tris(2,4-dihydroxyphenyl)-1,3, 5-triisopropylbenzene, 2,4,6-tris(3,5-dimethyl-4-hydroxyphenylthiomethyl)mesitylene, 1-[α-methyl-α-(4''-hydroxyphenyl)ethyl]-4-[α,α'-bis(4''-hydroxyphenyl)ethyl] benzene, 1-[α-methyl-α-(4'-hydroxyphenyl)ethyl]-3-[α,α'-bis(4''-hydroxy-phenyl)ethyl]benzene, 1-[alpha-methyl-α-(3',5'-dimethyl-4'-hydroxyphenyl)ethyl]benzene, 1-[α-methyl-α-(3'-methoxy-4'-hydroxyphenyl)ethyl]-4-[α',α'-bis (3'-methoxy-4'-hydroxyphenyl)ethyl]benzene, 1-[α-methyl-α-(2',4'-dihydroxyphenyl)ethyl]-4-[α',α'-bis(4'-hydroxyphenyl)ethyl]benzene, 1-[1'-methyl-1'-(4'-hydroxyphenyl)ethyl]-4-[1',1'-bis(4-hydroxyphenyl)ethyl] benzene, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl] methane, bis[3-(3,5-diethyl-4-hydroxybenzyl)-4-hydroxy-5-ethylphenyl]methane, 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis [4-hydroxy-3-(2-hydroxy-5-methylbenzyl)-5-methylphenyl]methane, bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[2,5-dimethyl-3-(2-hydroxybenzyl)-4-hydroxyphenyl] methane, 1,1-bis(4-hydroxyphenyl-1-[4-(4-hydroxybenzyl) phenyl]ethane, 1,1-bis(3,5-dimethyl-4-hydroxyphenyl-1-[4-(4-hydroxybenzyl)phenyl]ethane, 1,1-bis(3,5-dimethyl-2-hydroxyphenyl)-1-[4-(4-hydroxybenzyl)phenyl]ethane, 1,1-bis(4-hydroxy-3-methylphenyl)-1-[4-(4-hydroxybenzyl) phenyl]ethane, 1,1-bis(2,6-methyl-4-hydroxyphenyl)-1-[4-(4-hydroxybenzyl)phenyl]ethane, 1,1-bis(3,4-dihydroxyphenyl)-1-[4-(4-hydroxybenzyl)phenyl]ethane, 1,1-bis(3,4,5-trihydroxyphenyl)-1-[4-(4-hydroxybenzyl) phenyl]ethane, 1,1-bis(4-hydroxyphenyl)-1-[4-[1-(4-hydroxyphenyl)-1-methylethyl]phenyl]ethane, 1,1-bis(3,5-dimethyl-4-hydroxyphenyl)-1-[4-[1-(4-hydroxyphenyl)-1-methylethyl]phenyl]ethane, 1,1-bis(3,5-dimethyl-2-hydroxyphenyl)-1-[4-[1-(4-hydroxyphenyl)-1-methylethyl] phenyl]ethane, 1,1-bis(4-hydroxy-3-methylphenyl)-1-[4[1-(4-hydroxyphenyl)-1-methylethyl]phenyl]ethane, 1,1-bis(2, 6-dimethyl-4-hydroxyphenyl)-1-[4-[1-(4-hydroxyphenyl-1-methylethyl]phenyl]ethane, 1,1-bis(3,4-dihydroxyphenyl)-1-[4-[1 (4-hydroxyphenyl)-1-methylethyl]phenyl]ethane, 1,1-bis(3,4,5-trihydroxyphenyl)-1-[4-(1-(4-hydroxyphenyl)-1-methylethyl]phenyl]ethane, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis (4-hydroxy-2,5-dimethylphenyl)-2-hydroxyphenylmethane, bis(4-hydroxy-3,5-dimethylphenyl)-3,4-dihydroxyphenyl-methane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-[4-[1,1-bis(3-methyl-4-hydroxyphenyl) ethyl]benzene, 2,6-bis[1-(2,4-dihydroxyphenyl)isopropyl]-4-methylphenol, 4,6-bis[1-(4-hydroxyphenyl)isopropyl] resorcin, 4,6-bis(3,5-dimethoxy-4-hydroxyphenylmethyl) pyrogallol, 4,6-bis(3,5-dimethyl-4-hydroxyphenylmethyl) pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane, 4,4', 4''-ethylidinetrisphenol, 4-[bis(4-hydroxyphenyl)methyl]-2-ethoxyphenol, 4,4'-[(2-hydroxyphenyl)methylene]bis[2,3-dimethylphenol], 4,4'-[(3-hydroxyphenyl)methylene]bis[2, 6-dimethylphenol], 4,4'-[(4-hydroxyphenyl)methylene]bis [2,6-dimethylphenol], 2,2'-[(2-hydroxyphenyl)methylene] bis[3,5-dimethylphenol], 2,2'-[(4-hydroxyphenyl) methylene]bis[3,5-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1, 2-benzenediol, 4,6-bis[(3,5-dimethyl-4-hydroxyphenyl)methyl]-1,2,3-benzenetriol, 4,4'-[(2-hydroxyphenyl)methylene]bis[3-methylphenol], 4,4',4''-(3-methyl-1-propanyl-3-ylidine)trisphenol, 4,4',4'',4'''-(1,4-phenylenedimethylidine) tetrakisphenol, 2,4,6-tris[(3,5-dimethyl-4-hydroxyphenyl) methyl]-1,3-benzenediol, 2,4,6-tris[(3,5-dimethyl-2-hydroxyphenyl)methyl]-1,3-benzenediol, 4,4'-[1-[4-[1-[4-hydroxy-3,5-bis[(hydroxy-3-methylphenyl)methyl]phenyl]-1-methylethyl]phenyl]ethylidene]bis[2,6-bis(hydroxy-3-methylphenyl)methyl]phenol, and mixtures thereof.

The vinyl ether used herein has the formula

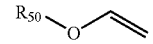

where $R_{50}$ is unsubstituted or substituted alkyl or unsubstituted or substituted cycloalkyl. Examples of vinyl ethers include ethyl vinyl ether, butyl vinyl ether, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, dimethylaminoethyl vinyl ether, diethylaminoethyl vinyl ether, butylaminoethyl vinyl ether, tetrahydrofurfuryl vinyl ether, and the like, etc.

A compound that can also be reacted with the, for example, hydroxystyrene/acrylate or novolak polymer/polyhydroxy compound having 2 to 7 phenolic groups, is an unsubstituted or substituted unsaturated heteroalicyclic compound such as, for example, 3,4-dihydro-2H-pyran.

The resin binders (1) to (5) are made by mixing the components to be reacted without the need for a catalyst. The method is exemplified in the examples below, but typically the reactions can be run between about 80° C. to about 140° C. for several hours, for example 6 to 24 hours.

Although any photoactive compound may be used in the photoresist, commonly a compound capable of producing a strong acid upon irradiation, a photoacid generator (PAG), of the novel composition is selected from those which absorb at the desired exposure wavelength, for example, below 370 nm, including 365 nm. The photogenerated acid deprotects the alkali insoluble polymer of the photoresist to give a polymer which is now soluble in the alkaline developer in the exposed regions. Any PAG may be used which generates a strong acid, particularly a sulfonic acid. Suitable examples of acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, nitrobenzyl sulfonate esters, and imidosulfonates, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluoromethane sulfonate, triphenylsulfonium nonafluorobutane sulfonate and the like. Other useful onium salts such as those disclosed in U.S. patent applications with Ser. No. 10/439,472-filed May 16, 2003, Ser. No. 10/609,735-filed Jun. 30, 2003, Ser. No. 10/439,753 filed May 16, 2003, and Ser. No. 10/863,042-filed Jun. 8, 2004, and are incorporated herein by reference. Other compounds that form an acid upon irradiation that may be used are triazines, oxazoles, oxadiazoles, thiazoles, substituted 2-pyrones. PAGS such as those described in US2002/0061464 are also useful. Phenolic sulfonic esters, trichloromethyltriazines, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide, N-hydroxynaphthalimide triflate, and their homologues are also possible candidates.

Other examples of photoactive compounds include

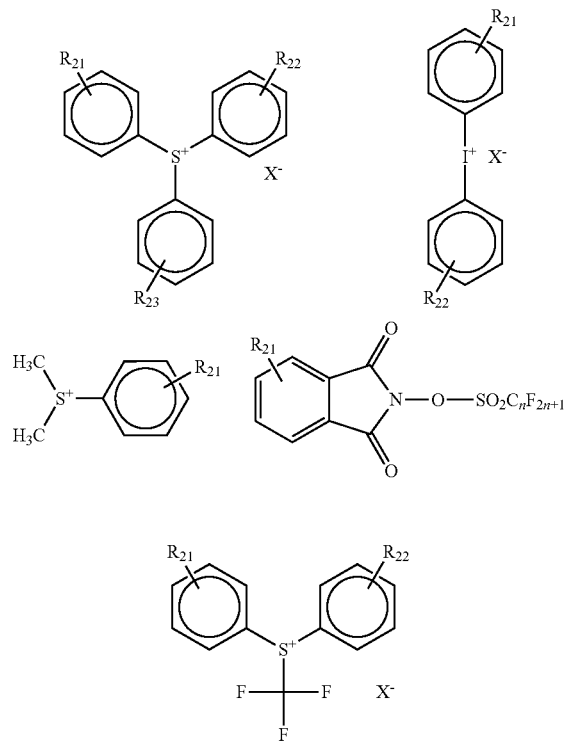

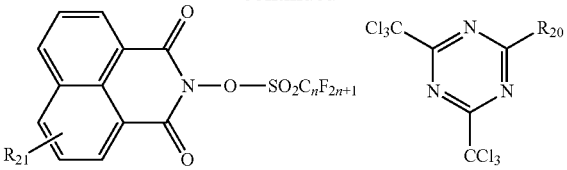

where $R_{21}$-$R_{23}$ are independently $(C_1$-$C_8)$alkyl or $(C_1$-$C_8)$ alkoxy substituents, $X^-$ is a sulfonate counterion, n=1-20, and $R_{20}$ is independently selected from $(C_1$-$C_8)$alkyl, $(C_1$-$C_8)$ alkoxy, phenyl, styrylphenyl, $(C_1$-$C_8)$alkoxy-styrylphenyl, furylethylidene, $(C_1$-$C_8)$alkyl substituted furylethylidene, naphthyl, $(C_1$-$C_8)$alkyl or $(C_1$-$C_8)$alkoxy substituted naphthyl. Mixtures of photoactive compounds may also be used; for example, a mixture of a triazine and an imide. The photoactive compound, for example, a photoacid generator, may be incorporated in a range from 0.1 to 10 weight % by solids, further from 0.3 to 5 weight % by solids, and more further 0.5 to 2.5 weight % by solids.

Bases may be added at levels from about 0.01 weight % to about 5 weight % of solids, further up to 1 weight % of solids, and more further to 0.07 weight % of solids. Examples of nitrogen containing bases include amines, such as triethylamine, triethanolamine, aniline, ethylenediamine, pyridine, tetraalkylammonium hydroxide or its salts (for example, tetramethylammonium hydroxide, tetramethylammonium acetate, tetrabutylammonium hydroxide, tetrabutylammonium acetate). Examples of photosensitive bases are diphenyliodonium hydroxide, dialkyliodonium hydroxide, trialkylsulfonium hydroxide, etc. The base may be added at levels up to 100 mole % relative to the photoacid generator. Although, the term base additive is employed, other mechanisms for removal of acid are possible, for instance by using tetraalkylammonium salts of volatile acids (e.g. $CF_3CO_2^-$) or nucleophilic acids (eg $Br^-$), which respectively remove acid by volatilization out of the film during post-exposure bake or by reaction of a nucleophilic moiety with the acid precursor carbocation (e.g. reaction of tert-butyl carbocation with bromide to form t-butylbromide).

The use of non volatile amine additives is also possible. Examples of amines would be ones having a sterically hindered structure so as to hinder nucleophilic reactivity while maintaining basicity, low volatility and solubility in the resist formulation, such as a proton sponge, 1,5-diazabicyclo[4.3.0]-5-nonene, 1,8-diazabicyclo[5,4,0]-7-undecene, cyclic alkylamines, or polyether bearing amines such as described in U.S. Pat. No. 6,274,286.

The photoresist herein may contain other components such as additives, surfactants, dyes, plasticizers, and other secondary polymers. Surfactants are typically compounds/polymers containing fluorine or silicon compounds which can assist in forming good uniform photoresist coatings. Certain types of dyes may be used to provide absorption of unwanted light. Plasticizers may be used, especially for thick films, to assist in flow properties of the film, such as those containing sulfur or oxygen. Examples of plasticizers are adipates, sebacates and phthalates. Surfactants and/or plasticizers may be added at concentrations ranging from 0.1 to about 10 weight % by total weight of solids in the photoresist composition.

In producing the photoresist composition, the solid components of the photoresist are mixed with a solvent or mixtures of solvents that dissolve the solid components of the photoresist. Suitable solvents for photoresists may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The prepared photoresist composition solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include, without limitation, silicon, copper, aluminum, polymeric resins, silicon dioxide, metals, doped silicon dioxide, silicon nitride, tantalum, polysilicon, ceramics, aluminum/copper mixtures; gallium arsenide and other such Group 111N compounds.

The photoresist coatings produced by the described procedure are particularly suitable for application to copper coated wafers, such as are utilized in the production of microprocessors and other miniaturized integrated circuit components. A silicon/silicon dioxide wafer can also be used. The substrate may also comprise various polymeric resins, especially antireflective coatings. The substrate may have an adhesion promoted layer of a suitable composition, such as one containing hexa-alkyl disilazane.

The photoresist composition solution is then coated onto the substrate, and the substrate is treated at a temperature from about 70° C. to about 150° C. for from about 30 seconds to about 6 minutes on a hot plate or for from about 15 to about 90 minutes in a convection oven. This temperature treatment is selected in order to reduce the concentration of residual solvents in the photoresist, while not causing substantial thermal degradation of the photoabsorbing compounds. In general, one desires to minimize the concentration of solvents and this first temperature treatment is conducted until substantially all of the solvents have evaporated and a coating of photoresist composition, on the order of 2-200 microns (micrometer) in thickness, remains on the substrate. Multiple coatings may be done to achieve thick films. The temperature is from about 95° C. to about 135° C. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm (nanometers) to about 450 nm, x-ray, electron beam, ion beam or laser radiation, in any desired pattern, produced by use of suitable masks, negatives, stencils, templates, etc. Generally, thick photoresist films are exposed using broadband radiation, using equipments such as Ultratech, Karl Suss or Perkin Elmer broadband exposure tools, although 436 nm and 365 nm Steppers may also be used.

The photoresist is then optionally subjected to a post exposure second baking or heat treatment either before or after development. The heating temperatures may range from about 90° C. to about 150° C., further from about 90° C. to about 130° C. The heating may be conducted for from about 30 seconds to about 3 minutes, further from about 60 seconds to about 2 minutes on a hot plate or about 30 to about 45 minutes by convection oven.

The exposed photoresist-coated substrates are developed to remove the image-wise exposed areas by immersion in a developing solution or developed by spray development process. The solution is can be agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One example of a hydroxide is tetramethyl ammonium hydroxide. Other include bases are sodium or potassium hydroxide. Additives, such as surfactants, may be added to the developer. After removal of the coated wafers from the developing solution, one may conduct an optional post-development heat treatment or bake to increase the coating's adhesion and density of the photoresist. The imaged substrate may then be coated with metals, or layers of metals to form bumps as is well known in the art, or processed further as desired.

The following examples provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Polymer 1

163.8 gm of 50% solution of poly hydroxystyrene/t-butyl acrylate copolymer (60%/40%; 10,000 Mw; available from DuPont) in PGMEA (81.9 gm solid polymer), 5.0 gm additional PGMEA and 10.45 gm ethyl vinyl ether (0.1451 moles)) were placed in round bottom 3 neck 250 ml flask, equipped with a condenser, a thermometer and magnetic stirrer (Teflon coated magnet). The system was sealed with rubber stoppers at the unused openings and condenser top. The solution was heated gradually to 120° C. and kept at that temperature under adequate agitation for 12 hours and then was subsequently cooled to room temperature. No residual ethyl vinyl ether was detected in the solution. The theoretical solids content of this solution was 51.52% and this solution was used as is in further examples.

The dissolution rate (as measured using the test method below) of a coating of poly hydroxystyrene/t-butyl acrylate copolymer before the reaction was 27 Å/second. The dissolution rate (as measured using the test method below) of a coating from Example 1 was 2.5 Å/second.

EXAMPLE 2

Polymer 2

87 gm of 50% solution of poly hydroxystyrene/t-butyl acrylate copolymer (60%/40%) in PGMEA (43.5 gm solid polymer) was added to 72.1 gm of 47.1% solution of m-cresol/formaldehyde novolak, having a dissolution rate of 730 Å/second (as measured using the test method below), in PGMEA (33.96 gm solids), 5.15 gm of additional PGMEA and 10.41 gm ethyl vinyl ether (0.14458 moles) were placed in round bottom 3 neck 250 ml flask, equipped with a condenser, a thermometer and magnetic stirrer (Teflon coated magnet). The system was sealed with a rubber stopper stoppers. The solution was heated gradually to 120° C. and kept at that temperature under adequate agitation for 8 hours and then was subsequently cooled to room temperature. No residual ethyl vinyl ether was detected in the solution. The theoretical solids content of this solution was 50.3% and this solution was used as is in further examples.

The dissolution rate (as measured using the test method below) of a coating of poly hydroxystyrene/t-butyl acrylate copolymer before the reaction was 70 Å/second. The dissolution rate (as measured using the test method below) of a coating from Example 2 was 4.12 Å/second.

EXAMPLE 3

Polymer 3

238.4 gm of a 46.8% solution m-cresol/formaldehyde novolak in PGMEA, having the dissolution rate of 1,000 Å/second (as measured using the test method below) (111.57 gm solids), additional 35.12 gm PGMEA and 74.62 gm of TRISP-PA (1.0364 moles) were placed in a round bottom, 3 neck 500 ml flask equipped with a condenser, a thermometer, an addition funnel and magnetic stirrer (Teflon coated magnet). The system was sealed with a rubber stopper at the top of the condenser. The solution was heated gradually to 110° C. and kept at that temperature under adequate agitation until all the TRISP-PA dissolved completely. The temperature of the solution was then raised to 120° C. 43.5 gm (0.604 moles) of ethyl vinyl ether was then added slowly to the reaction mixture over a 2 hours period to avoid pressure buildup. The reaction was allowed to continue at this temperature for another 20 hours and then was subsequently cooled to room temperature. No residual ethyl vinyl ether was detected in the solution. The theoretical solids content of this reaction solution was 58.6% and this solution was used as is in further examples.

The dissolution rate (as measured using the test method below) of a coating from Example 3 was 0.44 Å/second.

EXAMPLE 4

237.67 gm of a 46.8% solution m-cresol/formaldehyde novolak in PGMEA, having the dissolution rate of 1,000 Å/second (as measured using the test method below) (111.23 gm solids), additional 35 gm PGMEA and 74.97 gm of TRISP-PA (0.1768 moles) were placed in a round bottom, 3 neck 500 ml flask equipped with a condenser, a thermometer, an addition funnel and magnetic stirrer (Teflon coated magnet). The system was sealed with a rubber stopper at the top of the condenser. The solution was heated gradually to 110° C. and kept at that temperature under adequate agitation until all the TRISP-PA dissolved completely. The temperature of the solution was then raised to 120° C. 43.8 gm (0.6083 moles) ethyl vinyl ether was then added slowly to the reaction mixture over a 1.5 hours period to avoid pressure buildup. The reaction was allowed to continue at this temperature for another 20 hours and then was subsequently cooled to room temperature. No residual ethyl vinyl ether was observed in the final solution by stripping the solution. The theoretical solids content of this reaction solution was 58.7% and this solution was used as is in further examples.

The dissolution rate (as measured using the test method below) of a coating from Example 4 was 0.0.651 Å/second.

EXAMPLE 5

211.53 gm of a 46.5% solution m-cresol/formaldehyde novolak in PGMEA, having the dissolution rate of 1,700 Å/second (as measured using the test method below) (98.36 gm solids), additional 31.98 gm PGMEA and 65.49 gm of TRISP-PA (0.1544 moles) were placed in a round bottom, 3 neck 500 ml flask equipped with a condenser, a thermometer, an addition funnel and magnetic stirrer (Teflon coated magnet). The system was sealed with a rubber stopper at the top of the condenser. The solution was heated gradually to 110° C. and kept at that temperature under adequate agitation until all the TRISP-PA dissolved completely. The temperature of the solution was then raised to 120° C. 38.8 gm (0.539 moles) ethyl vinyl ether was then added slowly to the reaction mixture over a ½ hour period to avoid pressure buildup. The reaction was allowed to continue at this temperature for another 24 hours and then was subsequently cooled to room temperature. No residual ethyl vinyl ether was observed in the final solution by stripping the solution. The theoretical solids content of this reaction solution was 58.26% and this solution was used as is in further examples.

The dissolution rate (as measured using the test method below) of a coating from Example 5 was 0.327 Å/second.

EXAMPLE 6

146.3 gm of a 47.1% solution m-cresol/formaldehyde novolak in PGMEA, having the dissolution rate of 728 Å/second (as measured using the test method below) (68.91 gm solids), additional 30 gm PGMEA and 45 gm of TRISP-PA (0.1061 moles) were placed in a round bottom, 3 neck 500 ml flask equipped with a condenser, a thermometer, an addition funnel and magnetic stirrer (Teflon coated magnet). The system was sealed with a rubber stopper at the top of the condenser. The solution was heated gradually to 110° C. and kept at that temperature under adequate agitation until all the TRISP-PA dissolved completely. The temperature of the solution was then raised to 120° C. 27.7 gm (0.3847 moles) ethyl vinyl ether was then added slowly to the reaction mixture over a ½ hour period to avoid pressure buildup. The reaction was allowed to continue at this temperature for another 19 hours and then was subsequently cooled to room temperature. The theoretical solids content of this reaction solution was 56.87% and this solution was used as is in further examples.

The dissolution rate (as measured using the test method below) of a coating using the solution from Example 6 was not detectable over 2.5 hours of development with AZ-300MIF developer.

EXAMPLE 7

132.5 gm of a 47.1% solution m-cresol/formaldehyde novolak in PGMEA, having the dissolution rate of 728 Å/second (as measured using the test method below) (62.4 gm solids) and 22.4 gm of TRISP-PA (0.05283 moles) were placed in a round bottom, 3 neck 500 ml flask equipped with a condenser, a thermometer, an addition funnel and magnetic stirrer (Teflon coated magnet). The system was sealed with a rubber stopper at the top of the condenser. The solution was heated gradually to 110° C. and kept at that temperature under adequate agitation until all the TRISP-PA dissolved completely. The temperature of the solution was then raised to 120° C. 19 gm (0.2639 moles) ethyl vinyl ether was then added slowly to the reaction mixture over a ½ hour period to avoid pressure buildup. The reaction was allowed to continue at this temperature for another 4.5 hours then it was cooled to room temperature. The theoretical solids content of this reaction solution was 62.4% and this solution was used as is in further examples.

The dissolution rate (as measured using the test method below) of a coating using the solution from Example 7 was not detectable over 2.5 hours of development with AZ-300MIF developer.

Examples of Resist Formulations

Resist Example 1

This formulation was prepared by mixing 17.4 gm of the solution prepared in Example 1, 21.271 gm of Resist Example 1a (below), 1.3 gm of a 20% solution of Lutonal M40 (available from BASF) in PGMEA, 0.123 gm of a 5% solution of Monazoline C (available from Uniquem/ICI) in PGMEA and 0.005 gm of APS-137 surfactant (available from D.H. Litter Co., Elmsford, N.Y.).

Resist Example 1a was prepared by dissolving 0.55 gm of N-trifluoromethylsulfonyloxy-1,8-naphthalimide (hereinafter NIT) in 14.279 gm cyclohexanone, 4.556 gm of 30% solution of Lutonal M-40 in PGMEA, 80.05 gm of the solution prepared in Example 1, and 0.439 gm of a 17.7% solution of triethanolamine in diacetone alcohol.

Resist Example 2

This formulation was prepared by dissolving 0.55284 gm of NIT in 14.284 gm cyclohexanone, 79.985 gm of the solution prepared in Example 2, 4.581 gm 30% solution of Lutonal in PGMEA, 0.438 gm of 17.7% solution of triethanolamine in diacetone alcohol and added 0.04 gm of a 30% solution of APS-137 surfactant in PGMEA.

Resist Example 3

This resist formulation was prepared by dissolving 0.296 gm of NIT in 9.14 gm PGMEA, 67.443 gm of the solution prepared in Example 3, 2.068 gm of a 20% solution of Lutonal M-40 in PGMEA, 0.049 gm triethanolamine and 0.01 gm APS-137 surfactant.

Resist Example 4a

This resist formulation was prepared by dissolving 0.265 gm of NIT in 6.024 gm PGMEA, 41.213 gm of the solution prepared in Example 4, 14.651 gm 55% PHS/t-BA (60:40) polymer solution in PGMEA, 10.118 gm 47.1% cresol/formaldehyde solution in PGMEA, 3.719 gm of a 20% solution of Lutonal M-40 in PGMEA, 0.047 gm triethanolamine and 0.01 gm APS-137 surfactant.

Resist Example 4b

This resist formulation was prepared by dissolving 0.263 gm of NIT in 6.034 gm of cyclohexanone, 41.33 gm of the solution prepared in Example 4, 14.542 gm 55% PHS/t-BA (60:40) polymer solution in PGMEA, 10.14 gm 47.1% cresol/formaldehyde solution in PGMEA, 3.745 gm of a 20% solution of Lutonal M-40 in PGMEA, 0.059 gm triethanolamine and 0.01 gm APS-137 surfactant.

Resist Example 5

This formulation was prepared by blending 61.552 gm of Resist Example 5a (below) and 61.26 gm of Resist Example 5b (below).

Resist Example 5a was prepared by dissolving 0.399 gm of NIT in 3.9 gm PGMEA, 60.519 gm of the solution prepared in Example 5, 22.3 gm 55% PHS/t-BA (60:40) polymer solution in PGMEA, 15.095 gm 46.5% cresol/formaldehyde solution in PGMEA, 5.74 gm of a 20% solution of Lutonal M-40 in PGMEA, 0.15 gm 2,6-diisopropylaniline base and 0.005 gm APS-137 surfactant.

Resist Example 5b was prepared by dissolving 0.401 gm of NIT in 3.897 gm PGMEA, 60.369 gm of the solution prepared in Example 5, 22.42 gm 55% PHS/t-BA (60:40) polymer solution in PGMEA, 15.104 gm 46.5% cresol/formaldehyde solution in PGMEA, 5.819 gm of a 20% solution of Lutonal M-40 in PGMEA and 0.005 gm APS-137 surfactant.

Resist Example 6

This formulation is a blend of 35.077 gm of Resist Example 6a, 9.811 gm of Resist Example 6b, and 2.981 gm of a 47.1% cresol/formaldehyde novolak solution in PGMEA.

Resist Example 6a was prepared by dissolving 0.4 gm NIT in 9.8 gm cyclohexanone, 99.91 gm of the solution prepared in Example 6, 5.75 gm of 30% Lutonal M-40 solution in PGMEA, 0.44 gm of 17.7% triethanolamine solution in diacetone alcohol and adding 0.01 gm APS-137 surfactant.

Resist Example 6b is a blend of 45.9 gm of 50% solution of PHS/t-BA (60:40) in PGMEA and 50.1 gm Resist Example 6c.

Resist Example 6c was prepared by dissolving 0.336 gm NIT in 2.118 gm cyclohexanone, 6.514 gm of a 30% solution of Lutonal M-40 in PGMEA, 43.324 gm of a 50% solution of PHS/t-BA (60:40) in PGMEA and 0.193 gm of a 17.7% solution of triethanolamine in diacetone alcohol.

Resist Example 7

This formulation is a blend of 27.456 gm of Resist Example 7a, 11.847 gm of Resist Example 6b and 5.92 gm of a 47.1% cresol/formaldehyde novolak solution in PGMEA.

Resist Example 7a was prepared by dissolving 0.42 gm NIT in 9.754 gm cyclohexanone, 5.741 gm of a 30% solution of Lutonal M-40 in PGMEA, 9.787 gm of the solution prepared in Example 6, 89.54 gm of the solution prepared in Example 7, 0.465 gm of a 17.7% solution of triethanolamine in diacetone alcohol and 0.01 gm of APS-137 surfactant.

Resist Example 8

This formulation was prepared by blending 15.081 gm Resist Example 8a and 2.944 gm Resist Example 8b.

Resist Example 8a was prepared by dissolving 0.241 gm NIT in 7.93 gm cyclohexanone, 3.4 gm of a 20% solution of Lutonal M-40 in PGMEA, 39.38 gm of the solution prepared in Example 7, 0.2 gm of a 17.7% solution of triethanolamine in diacetone alcohol and 0.004 gm APS-137 surfactant.

Resist Example 8b was prepared by dissolving 0.41 gm NIT in 6.513 gm cyclohexanone, 2.21 gm of Lutonal M-40, 100.927 gm of a 50% solution of PHS/t-BA (60/40 polymer in PGMEA), 0.195 gm of a 17.7% solution of triethanolamine in diacetone alcohol and 0.01 gm APS-137 surfactant.

Resist Example 9

This resist formulation was prepared by dissolving 0.665 gm NIT in 8.799 gm of a 47.1% solution of m-cresol/formaldehyde novolak, 17.71 gm of Resist Example 6a, and 8.699 gm of Resist Example 6b.

Comparative Examples

Resist Example 10

Resist Example 8b alone was used.

Resist Example 11

This resist formulation was prepared by dissolving 0.306 gm of NIT in 6.73 gm cyclohexanone, 61.9 gm of 50% PHS/t-BA (60:40) polymer solution in PGMEA, 31.556 gm 47.1% cresol/formaldehyde solution in PGMEA, 9.7 gm of a 20% solution of Lutonal M-40 in PGMEA, 0.814 of a 5% Monazoline C solution in PGMEA and 0.01 gm of APS-137 surfactant.

Test Procedures:
Dissolution Rate Measurement:
This test was used to characterize different polymers and blends of polymers for their dissolution rate in alkaline aqueous developer. The process compares the dissolution rate of coatings of these polymers prepared under similar coating conditions, using optical interferometric technique to measure the change in coating thickness during development.
1—A 35% solids solution of the polymer in PGMEA is spin coated on an HMDS primed 4" Si wafer for 40 seconds
2—The coated wafer is baked at 110° C. hot plate for 3 minutes
3—The coated wafer is placed in a Perkin Elmer dissolution rate monitor (DRM) developer tank containing 300MIF developer at room temperature. The dissolution rate of the polymer is measured statically (without agitation) using the DRM for over two hours time.
4—The data is plotted and the dissolution rate for the polymer coating is extracted.

Resist Preparation:
The resist samples were prepared by dissolving the solids and polymer solutions as well as all the resist components together in plastic round bottles by rolling them on mechanical rollers for several hours until all solids are dissolved.
Resist Test:
Resist coatings are prepared on Cu wafers using spin coating and baking of the coated wafers for 10 minutes at 110° C. on a hot plate. The spin speed used was adjusted to produce 40 μm thick coated resist films for each sample depending on their viscosities.
The coated resist is exposed to patterned image with intense radiation in the range of 365-436 nm broad band wavelengths, then post exposure baked (PEB) at 90° C. for one minute. The exposure tool used for such test is a Suss aligner, model MA-200. The wafers were developed for at least 4 minutes in puddle mode with AZ-300MIF developer and rinsed with DI water.
The resist patterns were examined using electron microscope. The quality of the pattern was characterized by the steepness of the pattern side walls, the degree of resist foot at the wafer substrate and the resolution capability of the resist to resolve 10 μm lines and spaces with high integrity.
Results:
The relative polymer ratios of all resist formulations and their evaluation results are given in the table below.
All the inventive formulations of Resist Examples 1 to 9 produced resist patterns with steep sidewall profiles and absence of resist foot on Cu substrates, resolving 10 μm structures with full height in 40 μm thick films. Comparative Resist Examples 10 and 11, using the unmodified (not acetal blocked) PHS/t-BA copolymer as used in the above examples alone or blended with novolak resin produced either poor adhesion, causing the loss of some 10 μm resist patterns, or produced concave profiles and unresolved 10 μm lines.
The relative polymer composition of each resist formulation and testing results are set forth in the table below.
Acetal blocked novolak was excluded from this comparison since such blocked novolak resins in general will require very long development times to clear 40 μm resist thickness, typically greater than seven minutes, assuming their typical dissolution rates to be around 1,000 to 700 Angstroms per second or less. Therefore this can be used as a comparative example to show that acetal blocked blends of novolak and TRISP-PA, as in examples Resist 3 to Resist 9, produce fast development resist capable of clearing 40 μm resist thickness in 4 to 5 minutes development times.

TABLE

Polymer composition ratios of resists and evaluation results

| Resist Example | Polymer of Example No., wt % | PHS/tBA 60:40, wt % | Novolak, wt % | Thickness | 10 μm | Profile slope | Foot |
|---|---|---|---|---|---|---|---|
| 1 | Example 1, 100 | | | 40 μm* | resolved | steep | No foot |
| 2 | Example 2, 100 | | | 40 μm | resolved | steep | Slight foot |
| 3 | Example 3, 100 | | | 35 μm | resolved | steep | No foot |
| 4a | Example 4, 65.35 | 21.77 | 12.87 | 40 μm | resolved | steep | No foot |
| 4b | Example 4, 65.35 | 21.77 | 12.87 | 40 μm | resolved | steep | No foot |
| 5 | Example 5, 63 | 22 | 15 | 40 μm | resolved | steep | No foot |
| 6 | Example 6, 74.2 | 19.6 | 6.17 | 40 μm | resolved | steep | No foot |
| 7 | Example 6, 62.6 | 24.6 | 12.8 | 40 μm | resolved | steep | No foot |
| 8 | Example 7, 83 | 17 | | 40 μm | resolved | steep | No foot |

TABLE-continued

Polymer composition ratios of resists and evaluation results

| Resist Example | Polymer of Example No., wt % | PHS/tBA 60:40, wt % | Novolak, wt % | Thickness | 10 μm | Profile slope | Foot |
|---|---|---|---|---|---|---|---|
| 9 | Example 6, 51.3 | 33.1 | 15.6 | 40 μm | resolved | steep | No foot |
| 10 (8b) | | 100 | | 40 μm | Adhesion loss, lifted lines | steep | Slight foot |
| 11 | | 68 | 37 | 40 μm | 10 μm line erosion, unresolved | Poor concaved profiles | Present |

*double coating produced 40 μm thickness

The invention claimed is:

1. A method for forming a photoresist relief image on a substrate comprising: (a) applying on a substrate a layer of the photoresist composition comprising a resin binder comprising an acid labile group where the resin binder is a reaction product formed in the absence of a catalyst between (i) a novolak polymer, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a compound selected from a group consisting of vinyl ether and an unsubstituted or substituted heteroalicyclic, further where the components (i-iii) are reacted together at between 80° C. to 140° C., and (b) exposing the photoresist layer to activating radiation and developing the exposed photoresist layer wherein the layer is applied in a film of thickness in the range of 2 microns to 200 microns on a substrate and provide images with aspect ratios greater than 3.

2. The method of claim 1 wherein the photoresist composition further comprises a photoacid generator.

3. The method of claim 1 wherein the photoresist composition further comprises a base.

4. The method according to claim 1 wherein the vinyl ether has the formula

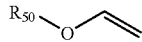

where $R_{50}$ is unsubstituted or substituted alkyl or unsubstituted or substituted cycloalkyl.

5. The method according to claim 1 wherein the unsubstituted or substituted heteroalicyclic is 3,4-dihydro-2H-pyran.

6. The method according to claim 1 where the substrate is selected from the group consisting of silicon, copper, aluminum, polymeric resins, silicon dioxide, metals, doped silicon oxide, silicon nitride, tantalum, polysilicon, ceramics, aluminum/copper mixtures, gallium arsenide and group III/V compounds.

7. The method according to claim 1 where the substrate is copper.

8. A method comprising the steps of:
(a) reacting in the absence of a catalyst components (i), (ii) and (iii) at a reaction temperature in the range of 80-140° C., and (b) forming a mixture comprising the resultant product of step (a), a photoacid generator and a solvent, thereby forming a photoresist composition, wherein (i), (ii) and (iii) are
(i) a novolak polymer, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a compound selected from a group consisting of vinyl ether and an unsubstituted or substituted heteroalicyclic.

9. The method of claim 8 wherein the vinyl ether has the formula

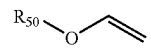

where $R_{50}$ is unsubstituted or substituted alkyl or unsubstituted or substituted cycloalkyl.

10. The method of claim 8 wherein the unsubstituted or substituted heteroalicyclic is 3,4-dihydro-2H-pyran.

11. The method of claim 8 where the mixture further comprises a base.

12. The method according to claim 8 wherein the reaction product comprises an acid labile group that requires a high activation energy for deblocking.

* * * * *